US 6,663,399 B2

(12) United States Patent
Ali et al.

(10) Patent No.: US 6,663,399 B2
(45) Date of Patent: Dec. 16, 2003

(54) SURFACE MOUNT ATTACHABLE LAND GRID ARRAY CONNECTOR AND METHOD OF FORMING SAME

(75) Inventors: Hassan O. Ali, San Jose, CA (US); Che-Yu Li, Ithaca, NY (US); Zhineng Fan, Santa Clara, CA (US); Ai D. Le, Sunnyvale, CA (US)

(73) Assignee: High Connection Density, Inc., Sunnyvale, CA (US)

( * ) Notice: Subject to any disclaimer, the term of this patent is extended or adjusted under 35 U.S.C. 154(b) by 0 days.

(21) Appl. No.: 10/060,749

(22) Filed: Jan. 29, 2002

(65) Prior Publication Data
US 2002/0102869 A1 Aug. 1, 2002

Related U.S. Application Data
(60) Provisional application No. 60/265,468, filed on Jan. 31, 2001.

(51) Int. Cl.⁷ .............................................. H01R 12/00
(52) U.S. Cl. ........................ 439/66; 439/71; 439/228; 439/591
(58) Field of Search ............................. 439/66, 591, 65, 439/71, 228, 91, 83

(56) References Cited
U.S. PATENT DOCUMENTS

| | | | |
|---|---|---|---|
| 5,800,184 A | * | 9/1998 | Lopergolo et al. ............ 439/66 |
| 5,911,583 A | * | 6/1999 | Roybal et al. ................. 439/66 |
| 6,079,987 A | * | 6/2000 | Matsunaga et al. ........... 439/66 |
| 6,097,609 A | * | 8/2000 | Kabadi ........................ 361/760 |
| 6,264,476 B1 | | 7/2001 | Li et al. |
| 6,312,266 B1 | | 11/2001 | Fan et al. |
| 6,354,844 B1 | * | 3/2002 | Coico et al. ................... 439/66 |
| 6,452,807 B1 | * | 9/2002 | Barrett ........................ 361/767 |

OTHER PUBLICATIONS

U.S. patent application Ser. No. 09/774,857, Hu et al., filed Jan. 31, 2001.
U.S. patent application Ser. No. 09/866,434, Fan et al., filed May 29, 2001.

* cited by examiner

*Primary Examiner*—P. Austin Bradley
*Assistant Examiner*—Edwin A. León
(74) *Attorney, Agent, or Firm*—Salzman & Levy

(57) ABSTRACT

The present invention is a cost effective, reworkable, LGA-based interconnection for use between two circuit members such as a ceramic module and an FR4-based system board. The resilient contact members allow the reliable interconnection of two circuit members, even though the circuit members may have significantly different CTEs and have interconnections where the distance from neutral point is great enough to crack BGA or CGA solder connections. For factory reworkable applications, the ends of the contact members are semi-permanently attached to both the module and the system board. For certain field separable applications, semi-permanently attaching only one of the ends of an LGA to either the module or the system board provides increased reliability.

2 Claims, 4 Drawing Sheets

SURFACE MOUNT ATTACHABLE LAND GRID ARRAY CONNECTOR AND METHOD OF FORMING SAME

RELATED PATENT APPLICATIONS

This application claims the benefit of Provisional application Ser. No. 60/265,468, filed Jan. 31, 2001.

This application is related to U.S. Pat. No. 6,264,476, issued to Li et al. for WIRE SEGMENT BASED INTERPOSER FOR HIGH FREQUENCY ELECTRICAL CONNECTION, which is based on application Ser. No. 09/457,776, filed Dec. 9, 1999; U.S. Pat. No. 6,312,266, issued to Fan et al. for CARRIER FOR LAND GRID ARRAY CONNECTORS, which is based on application Ser. No. 09/645,860, filed Aug. 24, 2000; copending U.S. patent application Ser. No. 09/774,857, filed Jan. 31, 2001; and copending U.S. patent application Ser. No. 09/866,434, filed May 29, 2001, which is a non-provisional application based on provisional application Ser. No. 60/227,689, filed Aug. 24, 2000; all of which are hereby incorporated by reference.

FIELD OF THE INVENTION

The present invention relates to electrical connectors and, more particularly, to electrical connectors for interconnecting electrical circuit members such as printed circuit boards, circuit modules, or the like, which may be used in information handling system (computer) or telecommunications environments.

BACKGROUND OF THE INVENTION

The current trend in the design of high speed electronic systems is to provide both high density and highly reliable interconnections between various circuit devices, which form important parts of these systems. The system may be a computer, a telecommunications network device, a handheld "personal digital assistant", medical equipment, or any other electronic equipment. High reliability for such connections is essential due to potential end product failure, should vital misconnections of these devices occur. Further, to assure effective repair, upgrade, and/or replacement of various system components (i.e., connectors, cards, chips, boards, modules, etc.), it is also highly desirable that such connections be separable and reconnectable in the field or at least reworkable at the factory. Also, with financial pressures on manufacturers to be cost competitive, it is also important that high-dollar-value assemblies be reworkable to maximize yields and minimize material to be scrapped.

Today's ceramic and polymeric composite modules are available in a wide variety of sizes and complexities ranging from small, single-chip modules with a few layers of wiring to multi-chip modules greater than 100 mm square, supporting over 100 chips and containing up to 90 layers of wiring. These modules have a coefficient of thermal expansion (CTE) that is significantly different from the mating structure, typically an FR4-based system board. For field separable applications, these modules predominantly use pin-and-socket or pin-grid-array (PGA) connectors for electrical interconnection to a system board. But for applications that do not require field separability, the most common methods of interconnection are ball grid array (BGA) and column grid array (CGA) technology. The two methods are similar in that they both comprise an array of solder connections, with a primary difference being that the CGA solder connections are taller. For a given module size, the taller CGA solder connections are more tolerant of the CTE mismatch, thus allowing the module and system board to be interconnected reliably with less concern for cracked solder joints.

As both the module size and the distance that the solder connections are located from the center of the module (i.e., the distance from neutral point (DNP)) continue to increase, even CGA solder connections can become unreliable especially due to thermal fatigue. These same concerns about broken interconnections also apply to PGA applications when the DNP is too large. Therefore, what is needed is an interconnection that is relatively flexible and capable of accommodating the thermal mismatch over an expected temperature range that can closely match the electrical performance and density of a BGA or CGA array.

One solution is to use a land grid array (LGA) connector. An array of interconnection elements, known as an interposer, is placed between the two arrays to be connected, and provides the electrical connection between the contact points or pads. Since the individual contact members of an interposer can be made resilient, they can accommodate the CTE mismatch between the module and system board. But since a retentive force is not inherent as in a pin-and-socket type interconnection, a clamping mechanism is needed to create the force necessary to ensure that each contact member is suitably compressed during engagement. This forms the required interconnections to the contact pads on the module and system board. While LGA interposers and clamps are implemented in many different ways, the implementations of most interest are those described in the aforementioned copending U.S. patent applications.

For factory reworkable applications, an LGA connector with its clamping mechanism may be more complex and costly than desired. But a significant advance in the art results when the ends of the contact members of an LGA connector are semi-permanently attached to contact pads on both the module and the system board. This technique provides all of the benefits of a reworkable interconnection, but with contact members providing significantly improved resilience and therefore improved reliability to handle CTE mismatches. Also, for certain field separable applications, the semi-permanent attachment of one end of an LGA connector to either the module or the system board can provide increased reliability, since there is only one field separable interface. Field separability allows the opportunity to upgrade or replace one or more defective devices without the entire system being returned to the factory or discarded.

It is therefore an object of the invention to provide a reworkable LGA-based interconnection for use between two primarily parallel circuit members.

It is an additional object of the invention to provide a reworkable LGA-based interconnection with resilient contact members.

It is another object of the invention to provide a reworkable LGA-based interconnection with enhanced retention.

It is another object of the invention to provide a reworkable LGA-based interconnection with enhanced reliability.

It is another object of the invention to provide a reworkable LGA-based interconnection that is cost effective to manufacture and assemble.

It is a still further object of the invention to provide a reworkable LGA-based interconnection that is field separable at one end.

SUMMARY OF THE INVENTION

The present invention is a cost effective, reworkable, LGA-based interconnection for use between two primarily parallel circuit members such as a ceramic module and an FR4-based system board. The resilient contact members allow the reliable interconnection of two circuit members, even though the circuit members may have significantly different CTEs and have interconnections where the DNP is great enough to crack BGA or CGA solder connections. For factory reworkable applications, the ends of the contact members are semi-permanently attached to both the module and the system board. For certain field separable applications, semi-permanently attaching only one of the ends of an LGA to either the module or the system board provides increased reliability due to only one field separable interface. The interconnection carrier provides improved retention of the individual contact members, resulting in interconnections with improved manufacturability, reliability and more uniform mechanical and electrical performance.

BRIEF DESCRIPTION OF THE DRAWINGS

A complete understanding of the present invention may be obtained by reference to the accompanying drawings, when taken in conjunction with the detailed description thereof and in which.

DETAILED DESCRIPTION OF THE PREFERRED EMBODIMENT

Generally speaking, the present invention is a cost effective, reworkable, LGA-based interconnection for use between two primarily parallel circuit members such as a ceramic module and an FR4-based system board. The resilient contact members allow the reliable interconnection of two circuit members, even though the circuit members may have significantly different CTEs and have interconnections where the DNP is great enough to crack BGA or CGA solder connections.

Figure 1A:
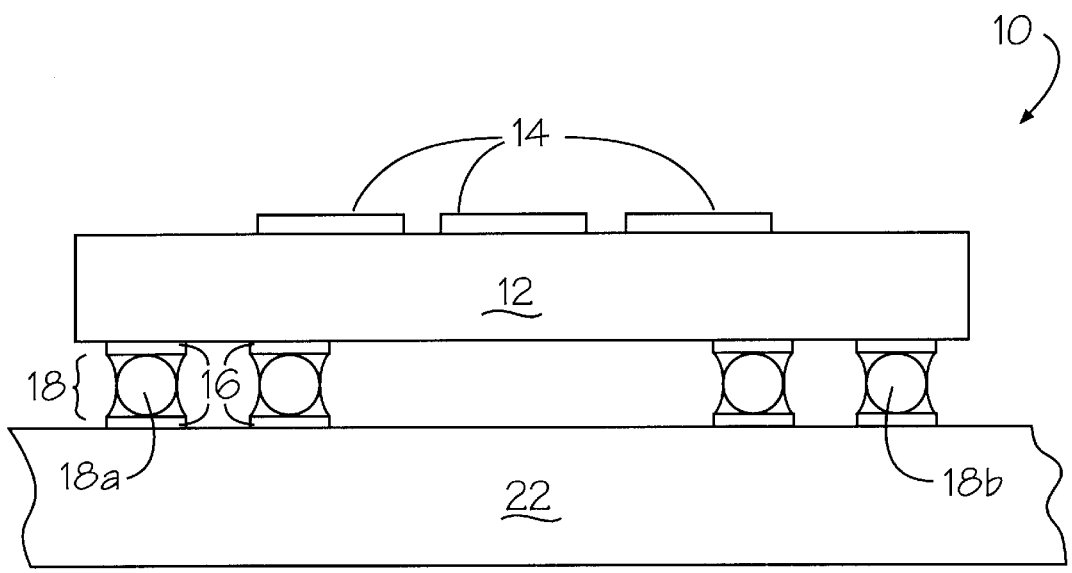
FIG. 1a is a side view, in section and on an enlarged scale, of an electronic package with BGA interconnections in accordance with the prior art.

Referring first to FIG. 1a, there is shown a side view, in section and on an enlarged scale, of electronic package 10 of the prior art for electrically interconnecting a pair of electrical circuit members 12 and 22. Examples of circuit members suitable for connection by interconnections 18 include printed circuit boards, circuit modules, flex circuits, etc. The term "printed circuit board" is meant to include but not be limited to a multilayered circuit structure including one or more conductive (i.e., signal, power and/or ground) layers therein. Such printed circuit boards, also known as printed wiring boards, are well known in the art and further description is not believed necessary. The term "circuit module" is meant to include a substrate or like member having various electrical components 14 (e.g., semiconductor chips, conductive circuitry, conductive pads, etc.), which may form part thereof. Such modules are also well known in the art and further description is not believed necessary. The term "flex circuit" is meant to include a printed circuit structure including one or more conductive (i.e., signal, power and/or ground) layers therein, of a dielectric material such as polyimide or like material, and optionally having various electrical components (e.g., semiconductor chips, passive devices, conductive circuitry, conductive pads, etc.), which may form part thereof. Such flex circuits are also well known in the art and further description is not believed necessary.

Corresponding thin, flat, contact pads 16 can be located on a bottom, external surface on circuit member 22 and a top, external surface on circuit module 12. Understandably, the contact pads 16 are electrically coupled to corresponding circuitry, which forms part of the respective electrical circuit members. These pads 16 may provide signal, power or ground connections, depending on the operational requirements of the respective circuit member. Contact pads 16 of circuit members 12 and 22 are interconnected through an array of BGA solder interconnections 18, which provides a reliable, inexpensive interconnection solution for factory reworkable applications where the CTE of circuit members 12 and 22 are closely matched or where the distance between the most remote solder connections 18a, 18b causes the DNP to be too large. Although it is not shown in FIG. 1a, the worst case condition for DNP in a square or rectangular array of BGA interconnections 18 is usually between those diagonally opposed corner solder balls located farthest apart.

Figure 1B:
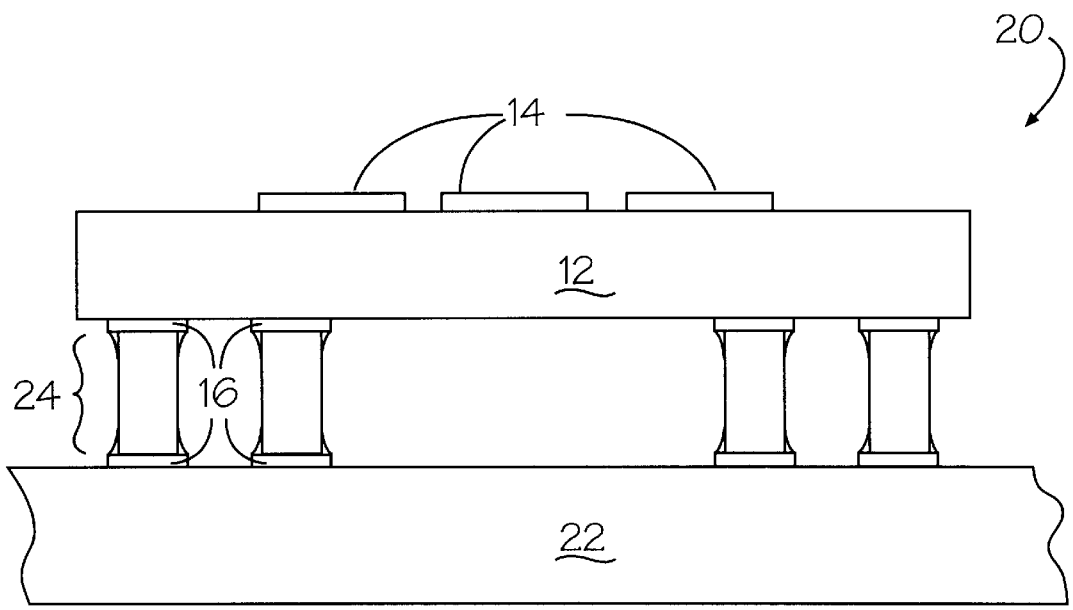
FIG. 1b is a side view, in section and on an enlarged scale, of the electronic package of FIG. 1a with CGA interconnections.

Referring now to FIG. 1b, there is shown a side view, in section and on an enlarged scale, of electronic package 20 of the prior art for electrically interconnecting a pair of electrical circuit members 12 and 22. For those factory reworkable applications where the CTE of circuit members 12 and 22 is significantly different or where the distance between the solder connections farthest apart causes a large DNP, longer length CGA solder interconnections 24 are a more reliable interconnection solution. CGA solder interconnections 24 handle the thermal mismatch better than the BGA case, but today there are many applications where even the taller CGA interconnections 24 will fail.

In one example, a 33 mm square ceramic module with a diagonal distance of 46.7 mm and a CTE of 7 parts per million (ppm) was soldered to an FR4-based circuit board that had a CTE of 17 ppm for an application where the temperature range was 150 degrees centigrade (C.). The difference in thermal mismatch over the 33 mm distance was 0.0014 inch while the difference over the 46.7 mm distance was 0.0019 inch, which is enough to fracture some of the CGA interconnections. Since even one broken interconnection may be enough to cause system failure, this was unacceptable.

Figure 2:
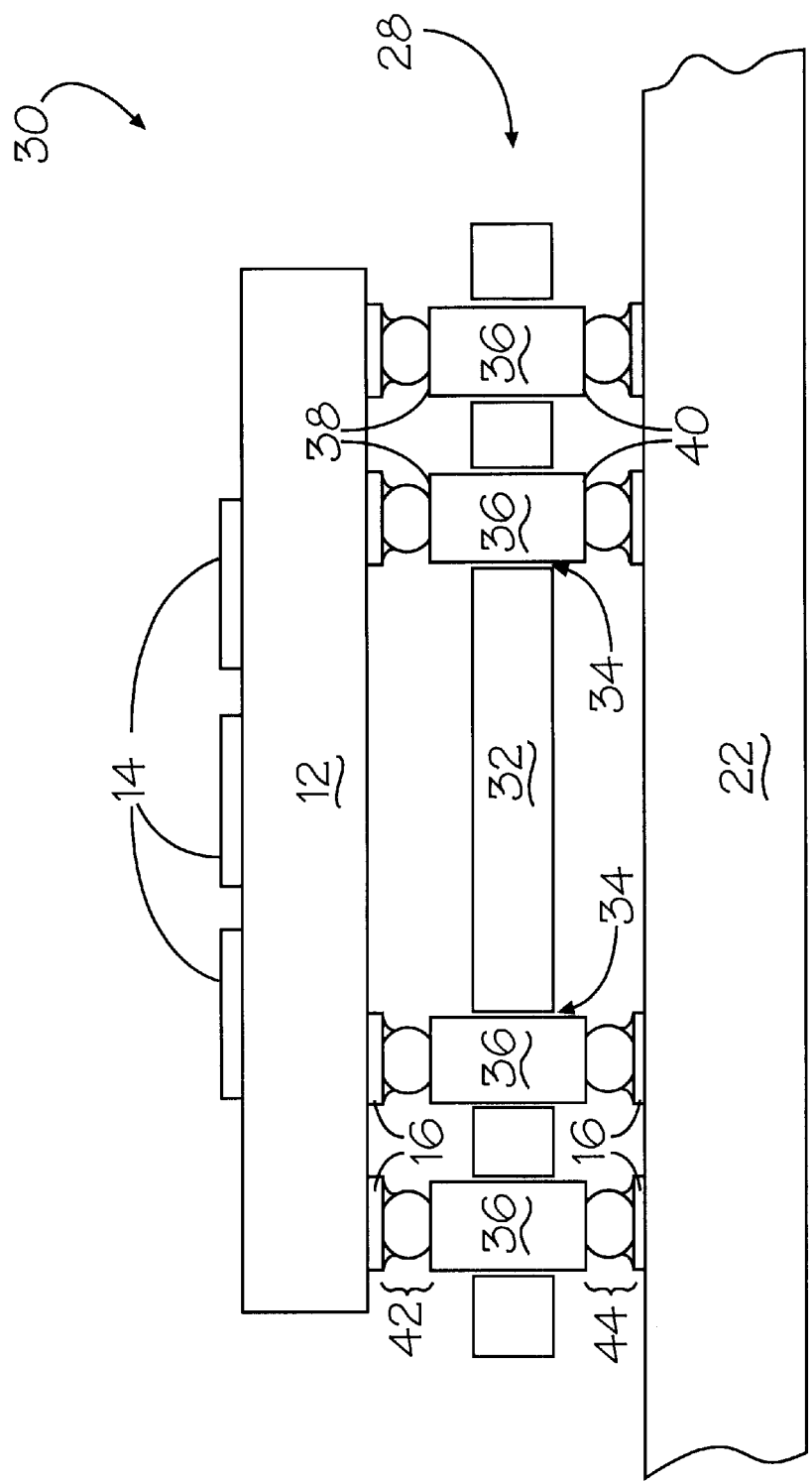
FIG. 2 is a side view, in section and on an enlarged scale, of an electronic package with interconnections in accordance with one embodiment of the present invention.

Referring now to FIG. 2, there is shown a side view, in section and on an enlarged scale, of an electronic package 30 of the present invention for electrically interconnecting a pair of electrical circuit members 12 and 22.

Interconnection 28 includes a common, electrically insulative carrier member 32 having a plurality of internal apertures or openings 34. The openings 34 are typically cylindrical in shape. Resilient contact members 36 are located so as to substantially occupy a respective opening 34 in carrier member 32. Contact members 36 are preferably of a construction and composition as taught in several of the referenced copending U.S. patent applications and patent. It is important to note that the array of interconnection 28 behaves mechanically very much like the referenced LGA connectors.

In one embodiment, each contact member 36 has a diameter of about 0.026 inch and a corresponding length of about 0.040 inch. Openings 34 have a diameter of 0.028 inch, just two thousandths of an inch larger than that of contact members 36. The center-to-center distance is 0.050 inch, but could be reduced to about 0.035 inch or less, if required. For any given application, an individual contact member may be used to provide a signal, power, or ground interconnection.

Each opposing end 38 and 40 of each contact member 36 is designed for electrically contacting contact pads 16 on respective circuit members 12 and 22 through corresponding arrays of solder interconnections 42 and 44. Compared to the prior art examples, the resilience of contact members 36 of interconnection 28 allows electronic package 30 to compensate for: circuit members 12 and 22 with significantly different CTEs; and/or circuit members 12 and 22 with interconnections where the DNP is great enough to crack BGA or CGA solder connections.

Carrier member 32 is designed for positioning between circuit members 12 and 22 and is aligned therewith. While carrier member 32 is shown in one of its simpler embodiments, for improved clarity of other elements and features of the invention, the teachings of other referenced copending U.S. patent applications are considered important aspects of the instant invention that significantly improve performance of carrier member 32. One teaches the mechanical and reliability improvement of carrier member 32 through the inclusion of features such as retentive members in openings 34, and layers of spacers located above and below the planar surfaces of carrier member 32. The recommendations of materials and processes of the aforementioned patent applications are also important to the improved manufacturability and lower cost of interconnection 28.

Figure 3A:
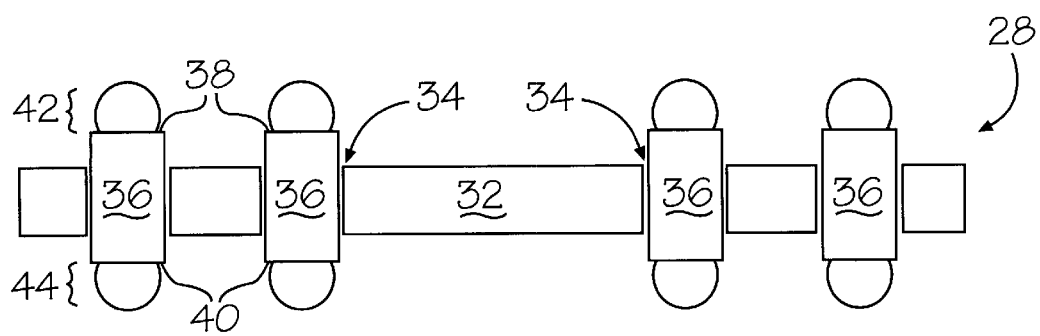
FIG. 3a is a side view, in section and on an enlarged scale, of one embodiment of an interconnection for use in the configuration shown in FIG. 2.

Referring now to FIGS. 3a–3d, there are shown some of the possible embodiments of interconnection 28 of FIG. 2. The embodiment of interconnection 28 shown in FIG. 3a is the same as shown in FIG. 2. Accordingly, interconnection 28 is as described hereinabove.

Figure 3B:
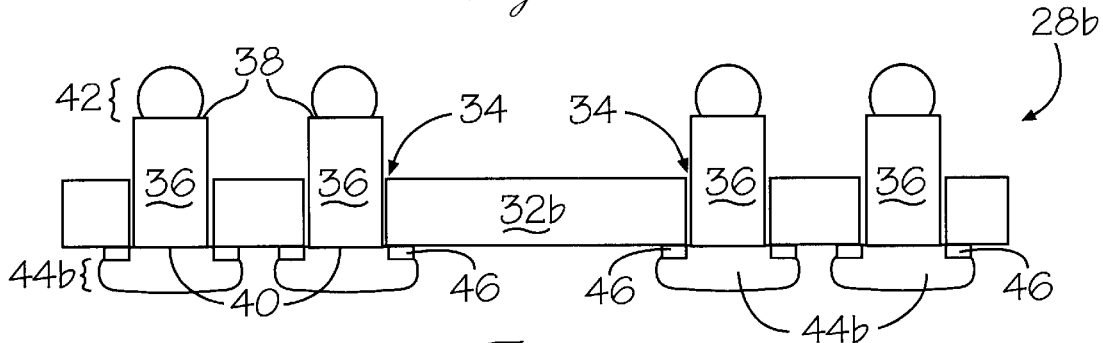
FIG. 3b is a side view, in section and on an enlarged scale, of a second embodiment of an interconnection for use in the configuration shown in FIG. 2.
Figure 3C:
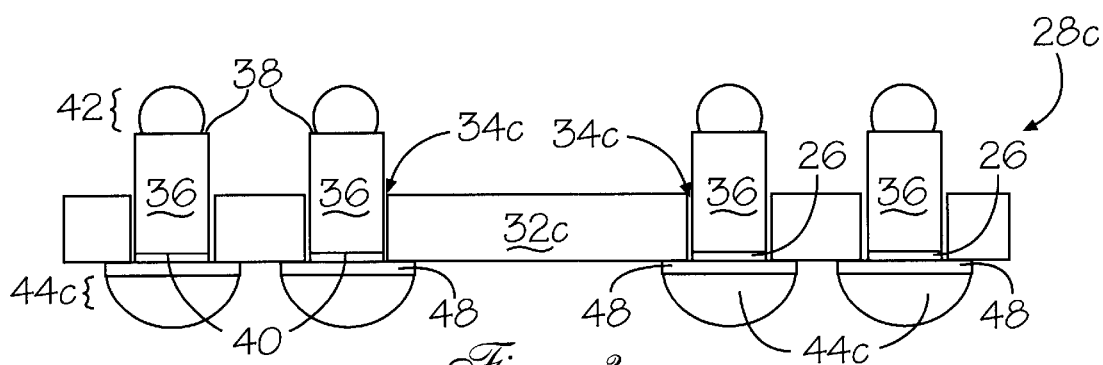
FIG. 3c is a side view, in section and on an enlarged scale, of a third embodiment of an interconnection for use in the configuration shown in FIG. 2.
Figure 3D:
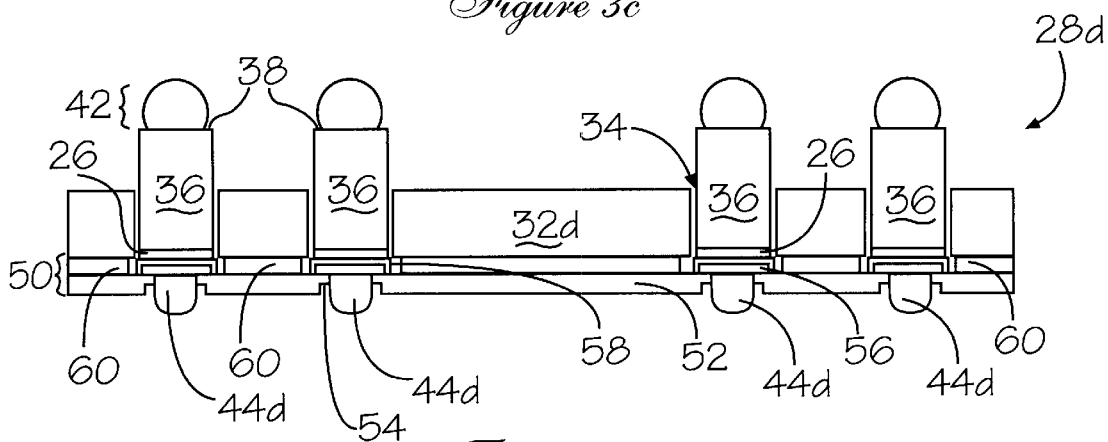
FIG. 3d is a side view, in section and on an enlarged scale, of a fourth embodiment of an interconnection for use in the configuration shown in FIG. 2.

The construction of interconnection 28 begins just as does the construction of LGA connectors as described in the referenced patent applications (including optional features such as the inclusion of retentive members in openings 34, and layers of spacers located above and below the planar surfaces of carrier member 32). Openings 34 in carrier member 32 may be formed by a process such as ablation, etching, routing, drilling, or punching. The possible inclusion of the optional features also applies to the other disclosed embodiments (FIGS. 3b–3d). Solder interconnections 42 and 44 may be added individually but it is preferable that they be added as arrays in order to better maintain uniform height.

The arrays of solder interconnections 42 and 44 may be attached in many different ways. One method, which involves the initial dipping of ends 38 or 40 of one array of the contact members 36 into molten solder followed by the other end 38 or 40, would have difficulty in maintaining uniform solder ball height. A preferred method is to fixture the LGA connector and to using a mask (not shown) aligned to and located near opposing ends 38 and 40 of the contact members 36. Solder balls may be placed in the openings (not shown) in the mask or solder paste may be screened into the openings and then the fixtured connector with the solder balls or solder paste is passed through an infrared reflow (IR) oven to attach/form the solder balls. During reflow, surface tension forms and helps to maintain the shape of the solder interconnections 42 and 44 on the ends 38 and 40 of the contact members 36. It is preferable that each array of solder interconnections 42 and 44 is applied and reflowed separately to enhance uniformity of the individual solder balls.

It is also possible for certain applications to use a different solder composition for each array of solder interconnections 42 and 44, thereby creating a solder hierarchy to allow the interconnection 28 to be attached to circuit members 12 and 22 of various materials in several possible configurations and sequences. Accordingly, whether interconnection 28 is attached first to circuit member 12 or circuit member 22 may vary depending on the specific application.

Referring now to FIG. 3b, there is shown interconnection 28b in accordance with an alternate embodiment of the invention. Compared to carrier member 32 (FIG. 3a), carrier member 32b is similar but includes a conductive ring 46 around each opening 34 containing a contact member 36 for applications where it may be advantageous to have even higher reliability solder interconnections 44b.

The construction of interconnection 28b is similar but not identical to the previous example. One method of making carrier member 32b is to begin with an FR4 substrate with a layer of conductive material (i.e., copper) on one surface. A process such as masking and subtractive etching could be used to form an array of solid contact pads. Conductive rings 46 could be formed at the same time as openings 34 by a process such as drilling or punching. Again, solder interconnections 42 and 44b may be added individually but it is preferable that they be added as arrays in order to better maintain uniform height.

While there are benefits to interconnection 28b over interconnection 28, it should be obvious that an array of larger solder interconnections 44b means that either the solder interconnections 44b are closer together or, if maintaining a specific spacing between adjacent solder interconnections 44b is important, the spacing between adjacent contact members 36 must increase. Also, it should be understood that, compared to the vertical symmetry of interconnection 28 (FIG. 3a), it is preferable that solder interconnections 44b be attached to the circuit member more closely matching the CTE of carrier member 32b. In the example shown in FIG. 2, solder interconnections 44b should be connected to FR4-based circuit member 22 and not to ceramic circuit member 12, in order to avoid the same problems encountered by the prior art examples.

Referring now to FIG. 3c, there is shown interconnection 28c in accordance with an alternate embodiment of the invention. Compared to carrier member 32b (FIG. 3b), carrier member 32c is similar but includes a conductive pad 48 over each opening 34c containing a contact member 36 for applications where it might be advantageous to have even higher reliability solder interconnections 44b.

The construction of interconnection 28c is similar but not identical to the previous two examples. One method of making carrier member 32c is to begin with a blank FR4 substrate, drill all necessary openings 34c, and then laminate a layer of conductive material (i.e., copper) on one surface. A process such as masking and subtractive etching could be used to form conductive pads 48. The ends 40 of contact members 36 must be electrically connected to corresponding conductive pads 48. One way to accomplish this is through an additional array of solder connections 26, which may be implemented by inserting a small amount of solidified solder in each opening 34c, inserting the contact members 36, and then passing the assembly through an IR oven.

Again, solder interconnections 42 and 44c may be added individually but it is preferable that they be added as arrays in order to better maintain uniform height. It should again be understood that, like interconnection 28b (FIG. 3b), it is preferable that solder interconnections 44c be attached to the circuit member more closely matching the CTE of carrier member 32c. In the example shown in FIG. 2, solder interconnections 44c should be connected to FR4-based circuit member 22 and not to ceramic circuit member 12, in order to avoid the same problems encountered by the prior art examples.

Referring now to FIG. 3d, there is shown an array of interconnections 28d in accordance with an alternate embodiment of the invention. Carrier member 32d is similar to carrier member 32b (FIG. 3b) but instead of forming an array of larger solder interconnections 44b (FIG. 3b), an interposer 50, preferably of a construction and composition as taught in one of the referenced copending U.S. patent applications, is used to provide the lower array of solder interconnections 44d.

Interposer 50 includes a dielectric layer 52 having a plurality of internal stepped apertures or openings 54, each one corresponding to and aligned with a conductive pad 56. In one example, dielectric layer 52 is composed of epoxy-glass-based materials (e.g., FR4) and is 0.010 inch thick. Other examples of suitable material for dielectric layer 52 are liquid crystal polymer (LCP), Kapton (a trademark of E. I. DuPont deNemours & Co., Wilmington, Del.) and Upilex (a trademark of Ube Industries, Ltd., Japan). These materials have a CTE that substantially matches the CTE of the adjoining structure. Dielectric layer 52 may also comprise more than one layer of material to allow the implementation of alternate methods of manufacture.

Solder interconnections 44d are intended to be located in corresponding stepped openings 54 and are in electrical contact with corresponding conductive pads 56. In one embodiment, the diameter of solder connections 44d is 0.026 inch and the height is 0.013 inch prior to reflow. Conductive pads 56 are copper, covered by a plating layer 58, which in this example is a 200 micro-inch thick layer of nickel covered by a 50 micro-inch thick layer of gold. In one example, the center-to-center distance of conductive pads 56 is 0.050 inch, but could be reduced to about 0.035 inch or less, if required.

The construction of carrier member 32d is similar to the construction of carrier member 32 (FIG. 2a), which consists of forming openings 34c. While interposer 50 could be clamped to carrier member 32d, it is preferable that the two elements be bonded together by means such as an adhesive layer 60. As in the example in FIG. 3c, the ends 40 of contact members 36 must be electrically connected to corresponding conductive pads 56. One way to accomplish this is through an additional array of solder connections 26, which may be implemented by inserting a small amount of solidified solder in each opening 34c, inserting the contact members 36, and then passing the assembly through an IR oven.

Compared to the examples in FIGS. 3b and 3c, interposer 50 of interconnection 28d includes a stepped opening 54 for each solder interconnection 44d to better contain the volume of solder. Again, it should be understood that, compared to vertical symmetry of interconnection 28 (FIG. 3a), it is preferable that solder interconnections 44d be attached to the circuit member more closely matching the CTE of carrier member 32d. In the example shown in FIG. 2, solder interconnections 44d should be connected to FR4-based circuit member 22 and not to ceramic circuit member 12, in order to avoid the same problems encountered by the prior art examples.

Figure 4:
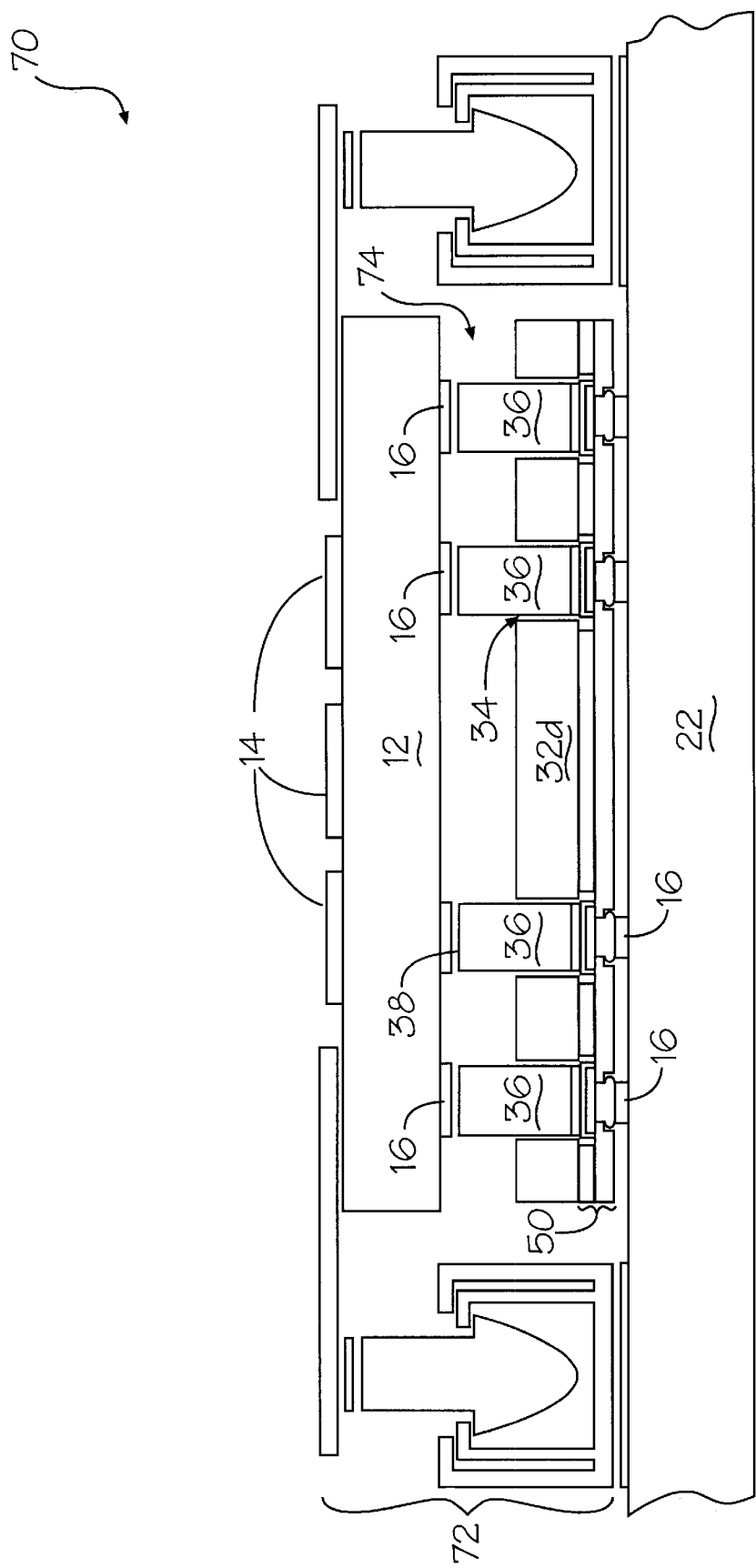
FIG. 4 is a side view, in section and on an enlarged scale, of an electronic package with field separable interconnections in accordance with another embodiment of the present invention.

Referring now to FIG. 4, there is shown a side view, in section and on an enlarged scale, of an electronic package 70 including field separable interconnection 74 for electrically interconnecting a pair of electrical circuit members 12 and 22 in accordance with another embodiment of the present invention. Electronic package 70 includes elements from other embodiments including circuit members 12 and 22 and interconnection 74, which is similar to interconnection 28d (FIG. 3d) but without upper solder interconnections 42.

Electronic package 70 also comprises field separable clamping means 72. Clamping means 72 is preferably of a construction and composition as taught in one of the referenced copending U.S. patent applications. Also, although a means for aligning circuit members 712 to interconnection 74 and circuit member 22 has not been shown specifically in this embodiment, it should be readily apparent to those skilled in the art of the multitude of methods that may be implemented.

Compared to field separable electronic packages with LGA connectors, the present invention offers improved reliability since only one end 38 is field separable. Which interconnection implementation is used and which end is field separable depends on the specific application. Other parameters that can be traded off include cost, operating temperature, and the density of contacts.

While, for example, modules comprising ceramic and polymeric composite, system boards comprising FR4, and semi-permanent connections of solder are used for purposes of disclosure, it should be obvious to those stilled in the art of the myriad possible design and manufacturing alternatives available, such as but not limited to the quantity, specific shape, dimensions, processes, and materials of the various elements of the invention, including the number and packaging of semiconductor elements and other components, which may vary depending on specific requirements. One specific example is the possible substitution of conductive adhesive instead of solder. These types of variations are well within the scope of the present invention.

Having thus described the invention, what is desired to be protected by Letters Patent is presented in the subsequently appended claims.

What is claimed is:

1. A surface mount attachable land grid array connector, comprising:
   a) a substrate comprising at least one layer of dielectric material having a top surface and a bottom surface;
   b) a plurality of openings in said substrate, each of said openings positioned to accept a single, resilient contact member;
   c) a plurality of resilient contact members respectively disposed in said plurality of openings, each having a first and second end, at least one of said first and second ends being semi-permanently attached to a contact pad on a first circuit member;
   d) an interposer and adhesive means located intermediate said interposer and said substrate, said interposer comprising:
   i) at least one second dielectric layer having one major surface and at least one edge;
   ii) a plurality of conductive pads, each having a first and second surface, spaced apart on said major surface of said at least one second dielectric layer, said first surface of said conductive pads being plated with at least one layer of metal, and at least a portion of said second surface of said conductive pads being readily adaptable for connection to a conductive member;
   iii) a plurality of second openings with a non-uniform cross section, each one corresponding to and aligned with one of said conductive pads; and
   iv) reworkable conductive material located within each one of said second openings and in electrical contact with said portion of said second surface of said conductive pads.

2. The surface mount attachable land grid array connector as recited in claim 1, wherein said reworkable conductive material comprises at least one of the materials: solder, and conductive adhesive.

* * * * *